United States Patent
Lai et al.

(10) Patent No.: US 7,135,377 B1
(45) Date of Patent: Nov. 14, 2006

(54) SEMICONDUCTOR PACKAGE SUBSTRATE WITH EMBEDDED RESISTORS AND METHOD FOR FABRICATING SAME

(75) Inventors: Zao-Kuo Lai, Hsin-chu (TW); Lin-Yin Wong, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 0 days.

(21) Appl. No.: 11/133,278

(22) Filed: May 20, 2005

(51) Int. Cl.
*H01L 29/76* (2006.01)

(52) U.S. Cl. .................................. 438/384; 438/667

(58) Field of Classification Search ............... 438/106, 438/382, 384, 629, 667
See application file for complete search history.

(56) References Cited

U.S. PATENT DOCUMENTS

| | | | | |
|---|---|---|---|---|
| 3,648,364 A | * | 3/1972 | Endo ........................... | 29/620 |
| 4,459,321 A | * | 7/1984 | Kim ............................. | 427/63 |
| 4,490,429 A | * | 12/1984 | Tosaki et al. ............ | 428/195.1 |
| 4,748,085 A | * | 5/1988 | Fukuda et al. ............... | 428/432 |
| 5,270,493 A | * | 12/1993 | Inoue et al. ................. | 174/253 |
| 6,108,212 A | * | 8/2000 | Lach et al. ................... | 361/768 |
| 6,278,356 B1 | * | 8/2001 | Lin et al. .................... | 338/309 |
| 6,458,670 B1 | * | 10/2002 | Nagasaka .................... | 438/382 |
| 6,939,738 B1 | * | 9/2005 | Nakatani et al. ............ | 438/108 |
| 2001/0023535 A1 | * | 9/2001 | Dunn .......................... | 29/847 |
| 2004/0150966 A1 | * | 8/2004 | Hu .............................. | 361/763 |
| 2006/0094156 A1 | * | 5/2006 | Lai et al. .................... | 438/106 |

* cited by examiner

*Primary Examiner*—T. N. Quach
(74) *Attorney, Agent, or Firm*—Clark & Brody; William F. Nixon

(57) ABSTRACT

A semiconductor package substrate with embedded resistors and a method for fabricating the same are proposed. Firstly, an inner circuit board having a first circuit layer thereon is provided, and a plurality of resistor electrodes are formed in the fist circuit layer. Then, a patterned resistive material is formed on the inner circuit board and electrically connected to the resistor electrodes to accurately define a resistance value of resistors. Subsequently, at least one insulating layer is coated on a surface of the circuit board having the patterned resistive material. At least one patterned second circuit layer is formed on the insulating layer and electrically connected to the resistor electrodes by a plurality of conductive vias formed in the insulating layer or plated through holes formed through the circuit board.

10 Claims, 10 Drawing Sheets

SEMICONDUCTOR PACKAGE SUBSTRATE WITH EMBEDDED RESISTORS AND METHOD FOR FABRICATING SAME

FIELD OF THE INVENTION

The present invention relates to semiconductor package substrates with embedded resistors and methods for fabricating the same, and more particularly, to a semiconductor package substrate having resistors embedded in a multi-layer circuit board and a method for fabricating the substrate, so as to provide good electrical performances for a semiconductor device using the substrate.

BACKGROUND OF THE INVENTION

Owing to the progress of semiconductor packaging technology and improvements in electrical performances for semiconductor chips, semiconductor devices are developed toward high integration. For example, a ball grid array (BGA) semiconductor device is characterized in that a plurality of array-arranged solder balls are formed on a bottom surface of a substrate and used as input/output (I/O) connections for electrically connecting a semiconductor chip mounted on the substrate to an external device such as printed circuit board (PCB). Compared to a conventional lead-frame based semiconductor device, the BGA semiconductor device advantageously provides more I/O connections on the same unit area of a chip carrier such as the substrate, and thus can accommodate more electronic circuits and semiconductor chips therein.

In accordance with high integration of the semiconductor device, more leads or contacts are required and also more noise is caused. Generally, for solving the noise problem, passive components such as resistors, capacitors and inductors are incorporated in the semiconductor device so as to eliminate the noise and stabilize the circuits, making a semiconductor chip packaged in the device have specific current characteristics.

FIG. 1 is a cross-sectional view showing a conventional passive component being mounted on a surface of a substrate. At least one pair of separate bond pads 11 are formed at predetermined positions on the surface of the substrate 10 and are exposed to a solder mask layer 12 that covers the substrate 10. Then, a solder paste 13 is applied on the bond pads 11, and two ends 140 of at least one passive component 14 are respectively attached to the bond pads 11 via the solder paste 13. A reflow process is performed to allow the passive component 14 to be bonded and electrically connected to the bond pads 11 on the substrate 10 via the solder paste 13. However, it is difficult to accurately control an applied amount of the solder paste 13, and the height of the solder paste 13 after being reflowed, as well as the surface flatness of the solder mask layer 12. Thereby, a gap 15 is usually left between the passive component 14 and the solder mask layer 12. In a high-temperature environment during subsequent fabrication processes, the solder paste 13 would melt or become softened and leaks to the gap 15 due to capillary attraction, which causes bridging of the solder paste 13 applied on the two bond pads 11 and short-circuiting of the passive components 14, and thus adversely affects the production yield.

Referring to FIG. 2 disclosed in U.S. Pat. No. 6,108,212, a bond pad 21 and at least one electrode 22 are formed on a surface of a substrate 20, and an electrically resistive volume 23 is disposed between the bond pad 21 and the electrode 22 to form a passive component comprising the bond pad 21, the electrode 22 and the electrically resistive volume 23. This allows the substrate 20 to be electrically connected to an external electronic device 25 such as printed circuit board by means of a metal bump 24 bonded to the bond pad 21. Also, the passive component formed by the bond pad 21, the electrode 22 and the electrically resistive volume 23 provides improved electrical performances for the semiconductor device. A pitch distance between the bond pad and the electrode on the surface of the substrate should be sufficiently large for successfully forming the electrically resistive volume having resistor effects. However, since the substrate has a limited surface area, a relatively large area occupied by the resistor would affect a layout of other circuits arranged on the substrate surface. This thus reduces flexibility of circuit routability on the substrate, sets a limitation on the number of passive components that can be incorporated on the substrate, and does not facilitate the high integration development for the semiconductor device. Furthermore, by the fact that the number of passive components to be incorporated is dramatically increased along with the requirement of high performances for the semiconductor device, if the foregoing method in which a semiconductor chip and a large number of passive components are simultaneously mounted on the substrate surface is employed, the size miniaturization for the semiconductor device can hardly be achieved.

In order to solve the above problem, U.S. Pat. No. 6,278,356 discloses a substrate 30 having a built-in layer passive component. Referring to FIG. 3, a copper layer 32 is formed respectively on an upper surface and a lower surface of an insulating layer 31, and the copper layer 32 is provided with an etching pattern 320. Then, a dielectric layer 33 is printed on the copper layer 32 and fills openings in the etching pattern 320. Subsequently, a resistive layer 34 is formed over the copper layer 32 and the dielectric layer 33 by the printing technique, wherein the resistive layer 34 serves as a resistor, and the dielectric layer 33 filling the openings in the etching patter 320 serves as a capacitor, so as to integrate a plurality of passive components on the substrate 30.

However, in the foregoing structure, only the printing technique is used to form the dielectric layer 33 and the resistive layer 34 on the substrate 30, such that it is difficult to accurately control the capacitance and resistance thereof respectively. Additionally, since the resistive layer 34 covers both the copper layer 32 and the dielectric layer 33 that are made of different materials, a reliability issue may be generated in a high-temperature and high-moisture environment during subsequent fabricating processes or tests, and thus electrical connection between the resistive layer and electrodes may also be affected.

Moreover, along with the blooming development of electronic industry, electronic products are gradually becoming more multi-functional and high efficient. In order to satisfy the requirements of high integration and size miniaturization for semiconductor packages, a circuit board for carrying active/passive components and circuits has been developed from a single-layer structure to a multi-layer board that employs the interlayer connection technique to enlarge usable circuit area on the circuit board, so as to incorporate a high circuit density in the circuit board. However, the foregoing prior art only discloses that passive components can be mounted on the surface of the substrate but does not provide a strategy to apply passive components to a multi-layer package substrate in accordance with the requirements of high integration and size miniaturization for the semiconductor package.

Therefore, the problem to be solved here is to incorporate an effective number of electronic elements such as passive components and semiconductor chips in a semiconductor package substrate with multiple layers of circuits, which can assure the fabrication reliability and accuracy and improve electrical performance of electronic products, without affecting circuit routability of the substrate and increasing the overall thickness of the semiconductor package, so as to meet the requirements of compact size, multiple functions and high electrical performances of the electronic products.

SUMMARY OF THE INVENTION

In light of the above drawbacks in the prior art, a primary objective of the present invention is to provide a semiconductor package substrate with embedded resistors and a method for fabricating the same, by which a multi-layer package substrate integrated with resistors is formed to meet the requirements of high integration and size miniaturization for semiconductor packages.

Another objective of the present invention is to provide a semiconductor package substrate with embedded resistors and a method for fabricating the same, by which a surface area being used on the substrate is reduced to make a semiconductor device compact in size.

Still another objective of the present invention is to provide a semiconductor package substrate with embedded resistors and a method for fabricating the same, which can improve the fabrication reliability and accuracy in resistance of the resistors.

A further objective of the present invention is to provide a semiconductor package substrate with embedded resistors and a method for fabricating the same, which can increase the number of passive components incorporated in a semiconductor device and improve flexibility of circuit routability of the substrate.

In accordance with the above and other objectives, the present invention proposes a semiconductor package substrate with embedded resistors. The resistors embedded in the substrate can thus be incorporated in a semiconductor device using the substrate without influencing circuit routability on the surface of the substrate.

The present invention also proposes a method for fabricating the above semiconductor package substrate with embedded resistors, which comprises the following steps. First, an inner circuit board having a first circuit layer thereon is provided and a plurality of resistor electrodes are formed in the first circuit layer. Subsequently, a patterned resistive material is formed on the inner circuit board and electrically connected to the resistor electrodes to define a resistance value of resistors. At least one insulating layer is formed on a surface of the circuit board having the patterned resistive material, and a plurality of vias are formed in the insulating layer to expose the resistor electrodes. Then, at least one second circuit layer is formed on the surface of the insulating layer, such that the second circuit layer is electrically connected to the resistor electrodes by the plurality of vias formed in the insulating layer.

A semiconductor package substrate with embedded resistors fabricated by the foregoing method in the present invention comprises: an inner circuit board having a first circuit layer thereon, the first circuit layer having a plurality of resistor electrodes; at least one patterned resistive material formed on the inner circuit board and electrically connected to the resistor electrodes to define a resistance value of resistors; at least one patterned second circuit layer formed on a surface of the circuit board having the patterned resistive material and spaced from the patterned resistive material by an insulating layer; and a plurality of conductive vias formed in the insulating layer, for electrically connecting the second circuit layer to the resistor electrodes.

In another embodiment, the method for fabricating a semiconductor package substrate with embedded resistors in the present invention comprises the following steps. First, an inner circuit board having a first circuit layer thereon is provided and a plurality of resistor electrodes are formed in the first circuit layer. Subsequently, a patterned resistive material is formed on the inner circuit board and electrically connected to the resistor electrodes to define a resistance value of resistors. At least one insulating layer is formed on a surface of the circuit board having the patterned resistive material, and at least one patterned second circuit layer is formed on the insulating layer. A plurality of plated through holes (PTH) are formed through the circuit board. And a plurality of conductive vias are formed in the insulating layer and electrically connect the second circuit layer to the resistor electrodes.

By the above fabrication method, a semiconductor package substrate with embedded resistors proposed in the present invention is obtained comprising: an inner circuit board having a first circuit layer thereon, the first circuit layer having a plurality of resistor electrodes; at least one patterned resistive material formed on the inner circuit board and electrically connected to the resistor electrodes; at least one patterned second circuit layer formed on a surface of the circuit board having the patterned resistive material and spaced from the patterned resistive material by an insulating layer; a plurality of plated through holes formed through the insulating layer and the circuit layers, and electrically connected to the circuit layers and the resistor electrodes; and a plurality of conductive vias formed in the insulating layer, for electrically connecting the second circuit layer to the resistor electrodes.

For the semiconductor package substrate with embedded resistors and the method for fabricating the same proposed in the present invention, a patterned first circuit layer is first formed on an inner circuit board and is provided with a plurality of resistor electrodes. Then, a patterned resistive material is applied on the inner circuit board and electrically connected to the resistor electrodes to define a resistance value of resistors. That is, the resistance value can be accurately determined according to the type of resistive material being used and the size such as length and area of the effective resistive material formed between the resistor electrodes, so as to improve accuracy in the resistance value of the resistors and reliability of the fabrication processes. Furthermore, the circuit layers can be electrically connected to the resistor electrodes by means of a plurality of plated through holes or conductive vias, so as to form a multi-layer package substrate with embedded resistors. This thus increases the number of passive components incorporated in the semiconductor device and improves flexibility of the circuit routability of the substrate, to meet the requirements of high integration and size miniaturization for the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

FIGS. 4A to 4G show the procedural steps of a method for fabricating a semiconductor package substrate with embedded resistors according to a preferred embodiment of the present invention.

Figure 1:
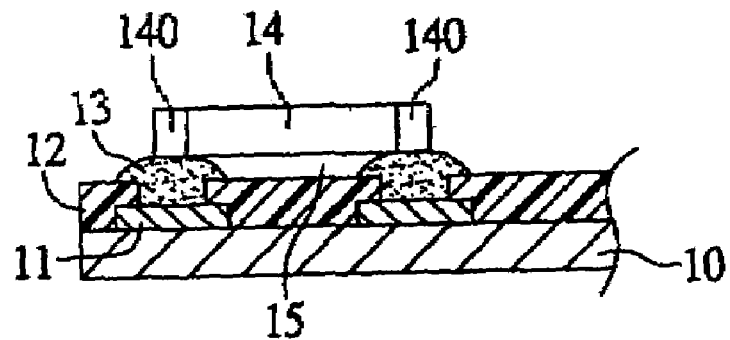
FIG. 1 (PRIOR ART) is a cross-sectional view showing a conventional passive component being mounted on a surface of a substrate.
Figure 2:
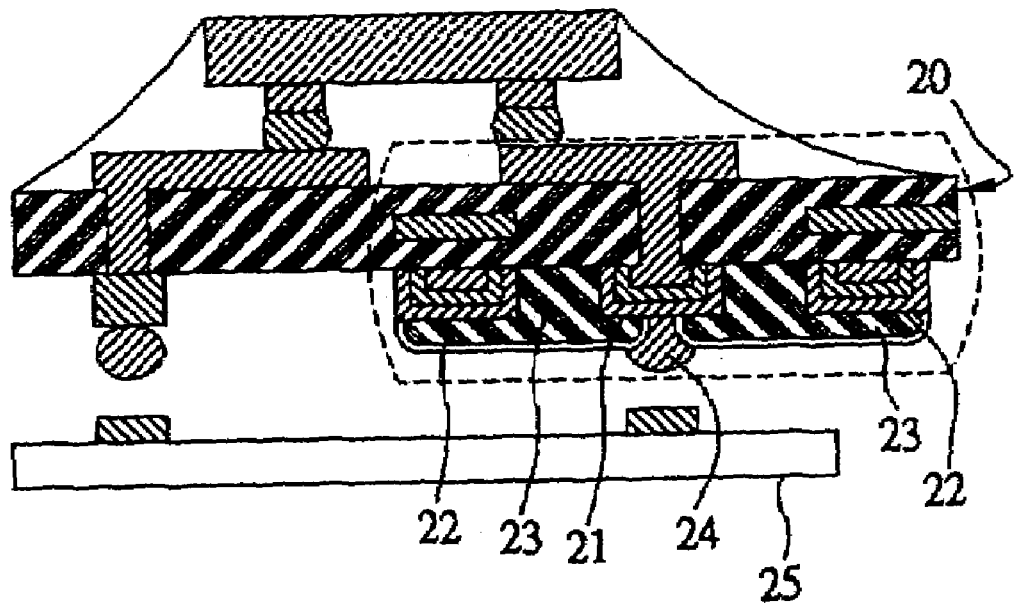
FIG. 2 (PRIOR ART) is a cross-sectional view of a substrate integrated with passive components according to U.S. Pat. No. 6,108,212.
Figure 3:
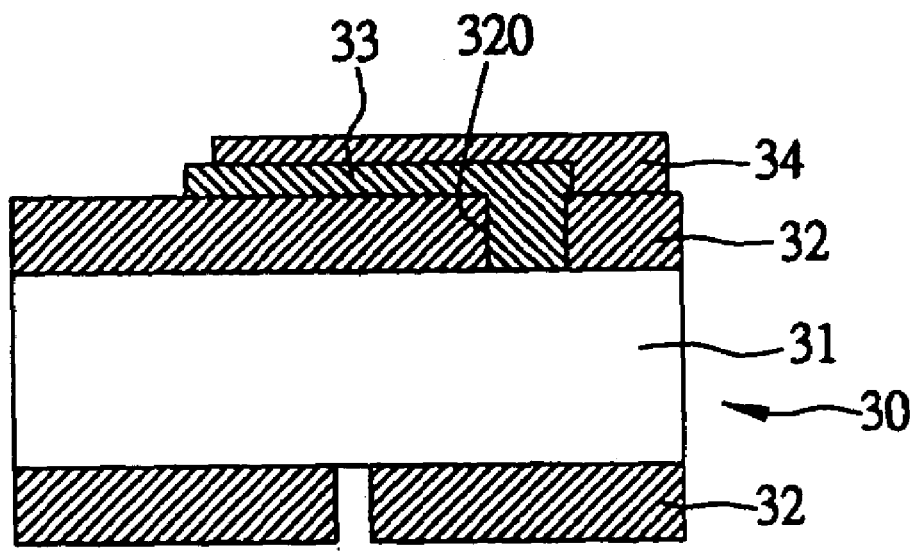
FIG. 3 (PRIOR ART) is a cross-sectional view of a substrate integrated with passive components according to U.S. Pat. No. 6,278,356.
Figure 4A:
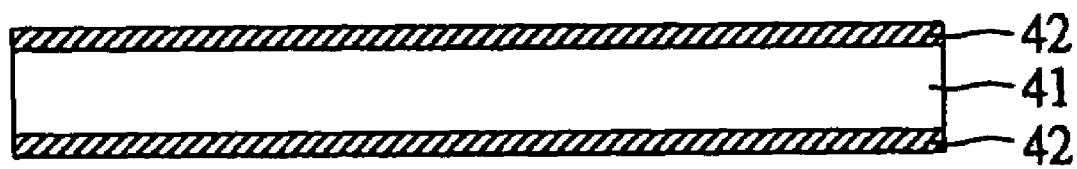
FIGS. 4A to 4G are cross-sectional views showing procedural steps of a method for fabricating a semiconductor package substrate with embedded resistors according to a preferred embodiment of the present invention.

First, referring to FIG. 4A, an inner circuit board 41 is provided and a conductive metal layer 42 is formed on a surface of the inner circuit board 41. The conductive metal layer 42 can be made of copper metal or any other conductive metal. The inner circuit board 41 may be a double-layer circuit board or a multi-layer circuit board.

Figure 4B:
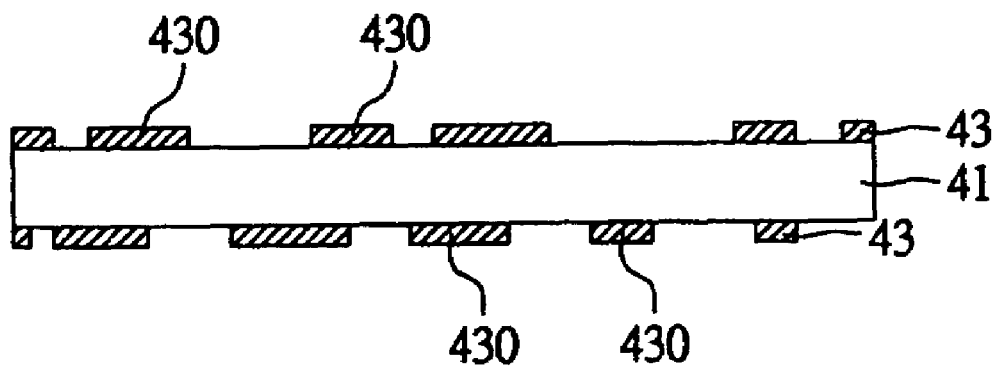

Referring to FIG. 4B, the conductive metal layer 42 is patterned to form a first circuit layer 43 by an etching process. Alternatively, the inner circuit board 41 can be a multi-layer circuit board and the first circuit layer 43 is formed on a superficial insulating layer of the multi-layer circuit board. The first circuit layer 43 comprises a plurality of resistor electrodes 430 for being subsequently electrically connected to resistors.

Figure 4C:
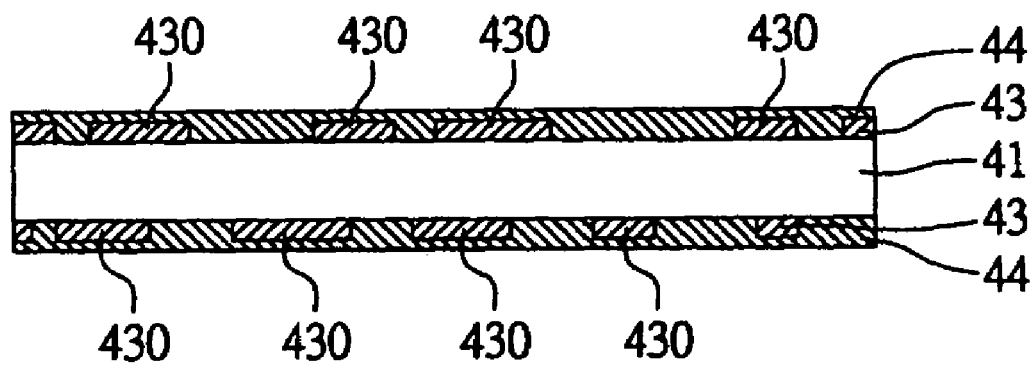
Figure 4D:
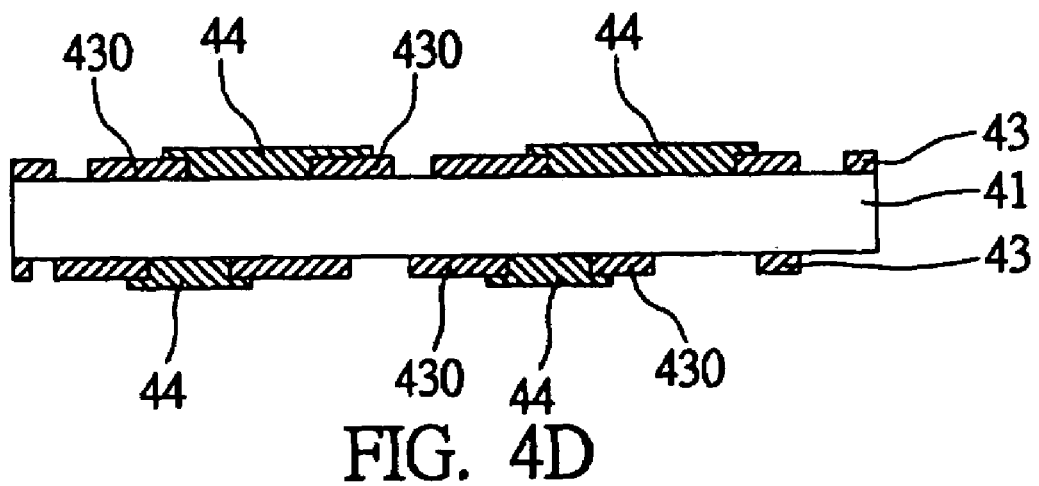
Figure 4C:
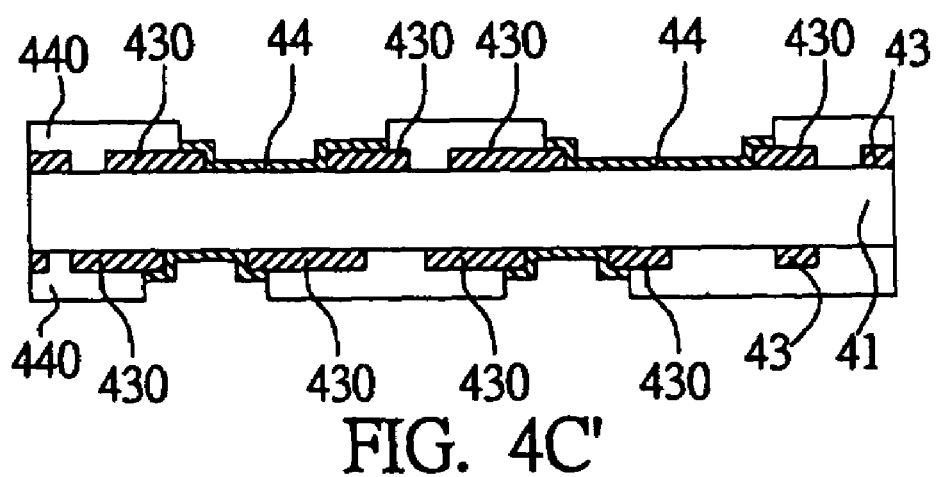
Figure 4D:
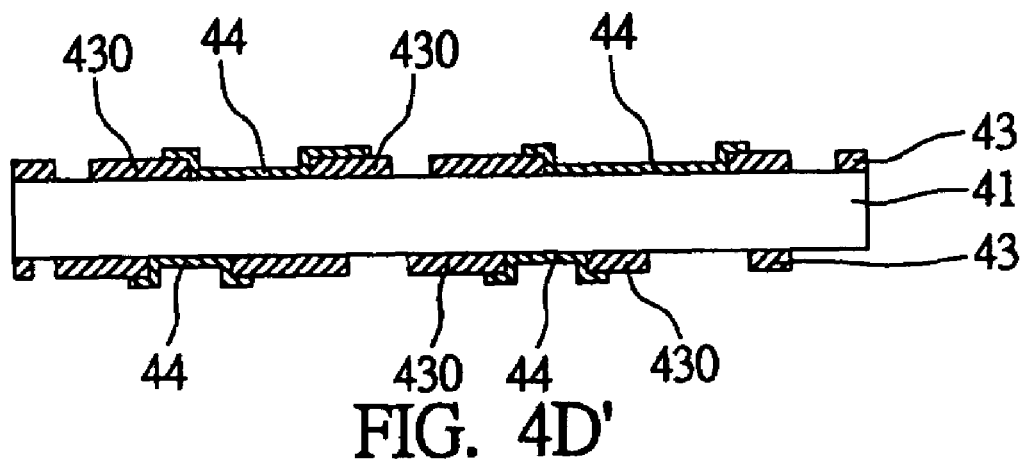

Referring to FIG. 4C, a resistive material 44 is applied on the inner circuit board 41. The resistive material 44 can be a thick film resistive material or a thin film resistive material. The thick film resistive material may be made of silver powders or carbon particles dispersed in a resin, or ruthenium oxide ($RuO_2$) and glass powders dispersed in a binder to be applied and cured. As shown in FIG. 4C, the thick film resistive material 44 on the inner circuit board 41 is patterned by a laser or etching technique, allowing the resistive material 44 to be electrically connected to the resistor electrodes 430 and partially or completely cover the electrodes 430, such that the resistance of resistors can be accurately defined and the reliability thereof can also be improved (as shown in FIG. 4D). Alternatively, the thick film resistive material 44 can be directly deposited on the resistor electrodes 430 by a screen-printing technique. Subsequently, the thick film resistive material 44 can be patterned by the laser or etching technique to be electrically connected to the resistor electrodes 430 and accurately define the resistance of the resistive material 44.

Alternatively, referring to FIGS. 4C' and 4D', if the resistive material 44 is the thin film resistive material such as nickel-chromium (Ni—Cr) alloy, nickel-phosphorus (Ni—P) alloy, nickel-tin (Ni—Sn) alloy, chromium-aluminum (Cr—Al) alloy or titanium nitride (TaN) alloy, a patterned thin film resist layer 440 is first formed on the substrate to define an area for depositing the thin film resistive material. Then, the thin film resistive material 44 is deposited in openings of the resist layer 440 by a sputtering, electroplating or electroless plating technique, so as to allow the resistive material 44 to partially or completely cover the resistor electrodes 430 and be electrically connected to the resistor electrodes 430. Subsequently, the resist layer 440 is removed. In this embodiment, the subsequent fabrication processes are described primarily for fabricating build-up layers on the thick film resistive material.

The selection of either the thick film resistive material or the thin film resistive material depends on the fabrication cost of a multi-layer package substrate and the electrical accuracy of passive components being fabricated. Further, a desirable resistance value required for the semiconductor package substrate can be determined according to the type of resistive material being used and the size of the resistive material formed between the resistor electrodes. The resistive material may partially or completely cover the electrodes, so as to prevent a reliability issue caused in a high-temperature and high-moisture environment during subsequent fabrication processes and tests, and not to influence the electrical connection between the resistive material and the electrodes.

Figure 4E:
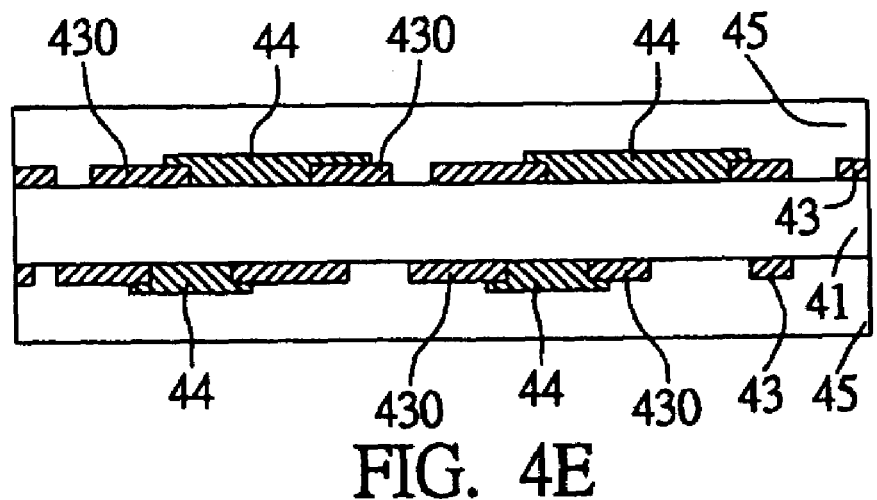

Referring to FIG. 4E, at least one insulating layer 45 is formed over the patterned resistive material 44 on the surface of the circuit board 41. The insulating layer 45 can be made of an insulating organic material or a ceramic material, such as epoxy resin, polyimide, bismaleimide triazine-based resin, photoimagable resin, or a composite material thereof with glass fibers. A roller coating, printing or lamination technique can be applied to form the insulating layer 45. It should be understood that the insulating layer 45 is not limited to being made of a single organic material, but can also be laminated by different insulating material layers.

Figure 4F:
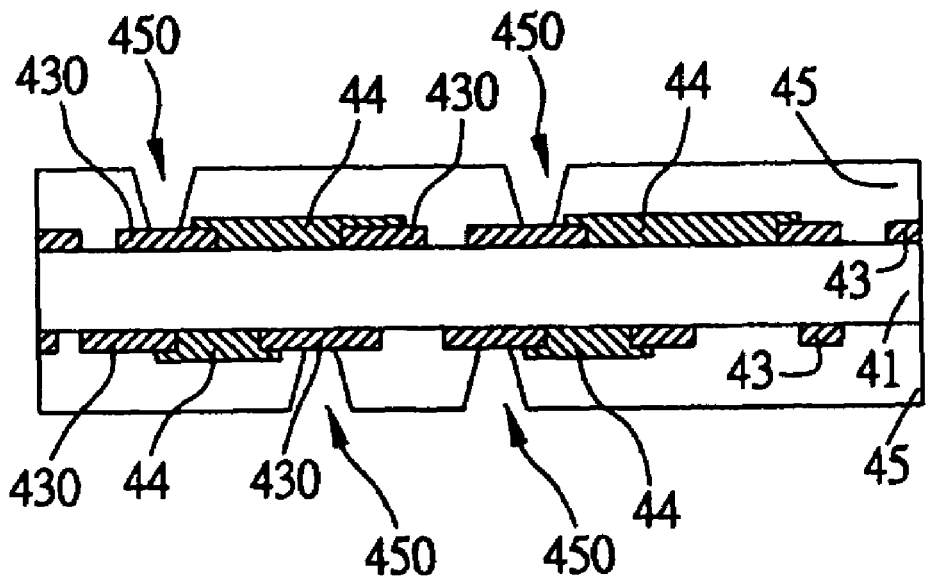

Referring to FIG. 4F, a plurality of vias 450 are formed in the insulating layer 45 by one of a mechanical drilling, laser drilling technique, or photolithographic technique, wherein at least one of the vias 450 exposes at least one of resistor electrodes 430.

Figure 4G:
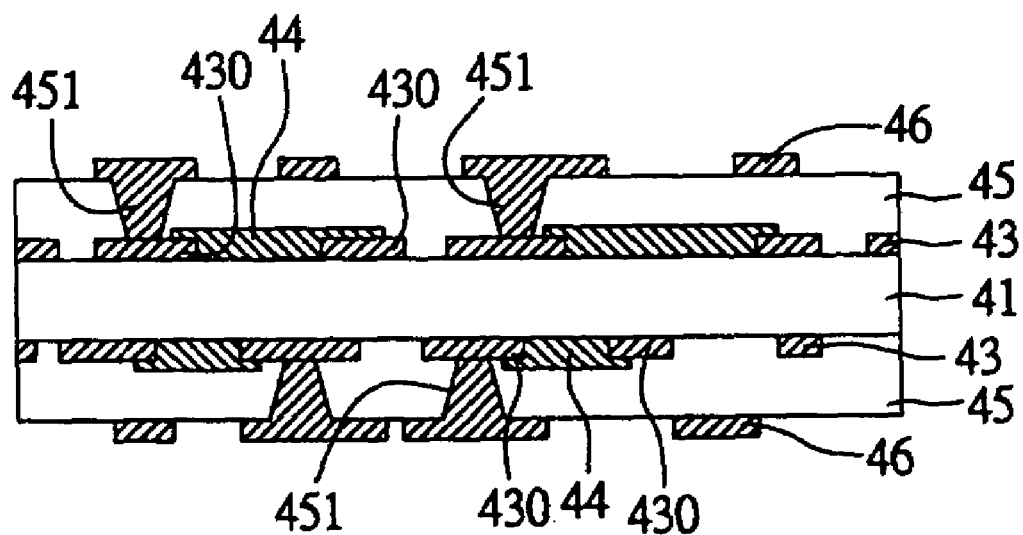

Referring to FIG. 4G, a patterned second circuit layer 46 and a plurality of conductive vias 451 are respectively formed on a surface of the insulating layer 45 and in the vias 450, such that the second circuit layer 46 is electrically connected to the resistor electrodes 430 by the conductive vias 451. This thereby completely fabricates a multi-layer package substrate with embedded resistors. The second circuit layer can be formed by a build-up or lamination technique; for example, an electroplating process may be used together with the build-up technique to form such patterned circuit layer, or alternatively, a copper foil can be pressed and etched to form the patterned circuit layer. Certainly, more insulating layers and circuit layers can be further built up on a surface of the substrate to fabricate a package substrate with more circuit layers. The substrate can be a flip-chip package substrate or a wire-bonding package substrate.

FIGS. 5A to 5H show the procedural steps of a method for fabricating a semiconductor package substrate with embedded resistors according to another preferred embodiment of the present invention, wherein the fabrication processes shown in FIGS. 5A to 5E are the same as those in FIGS. 4A to 4E and therefore not to be further repeated here.

Figure 5A:
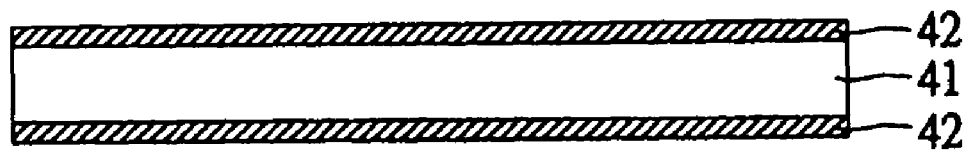
FIGS. 5A to 5H are cross-sectional views showing procedural steps of a method for fabricating a semiconductor package substrate with embedded resistors according to another preferred embodiment of the present invention.
Figure 5B:
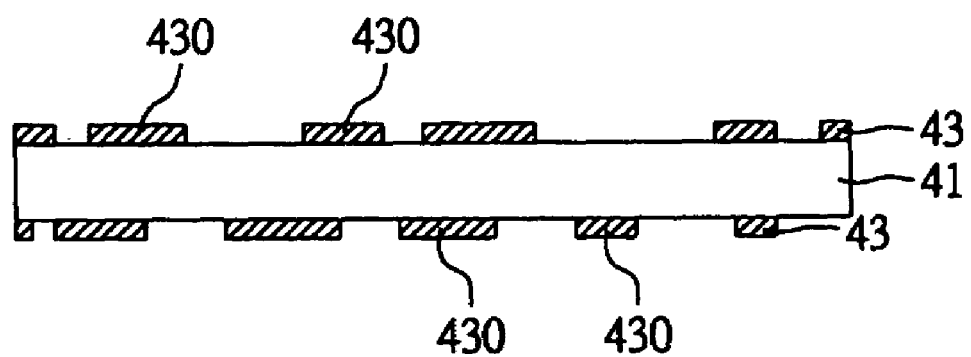
Figure 5C:
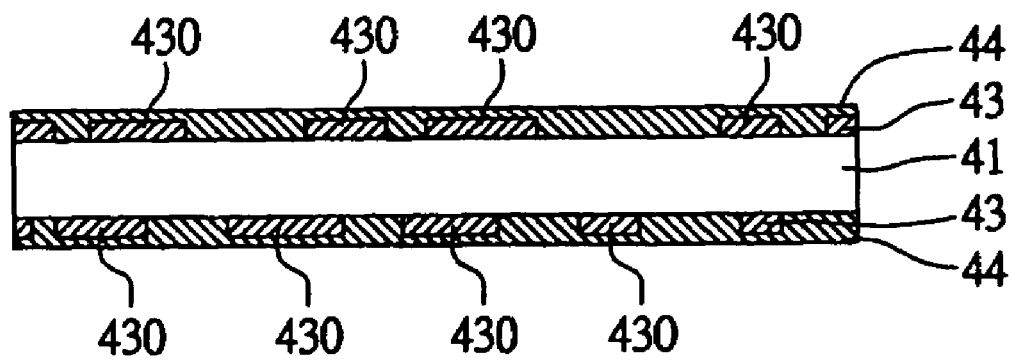
Figure 5D:
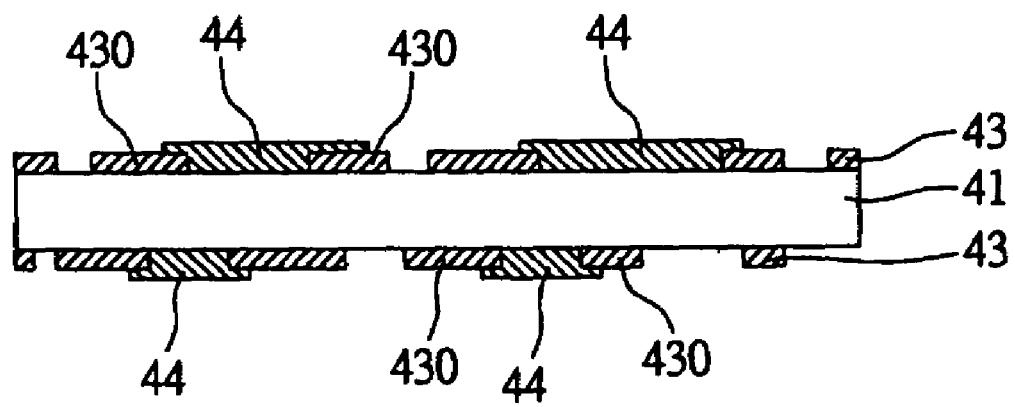
Figure 5E:
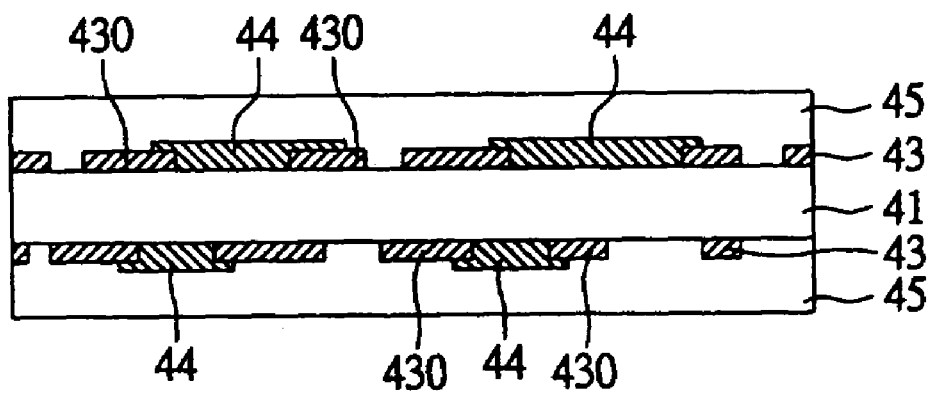
Figure 5F:
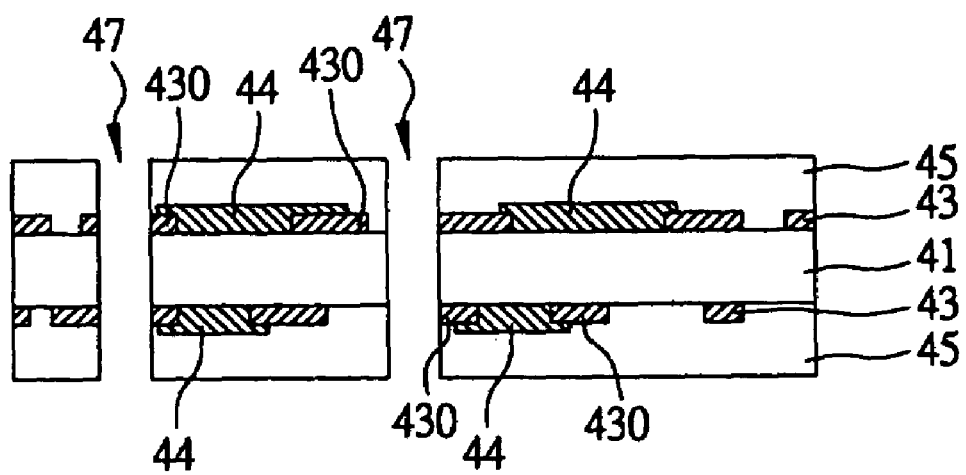
Figure 5G:
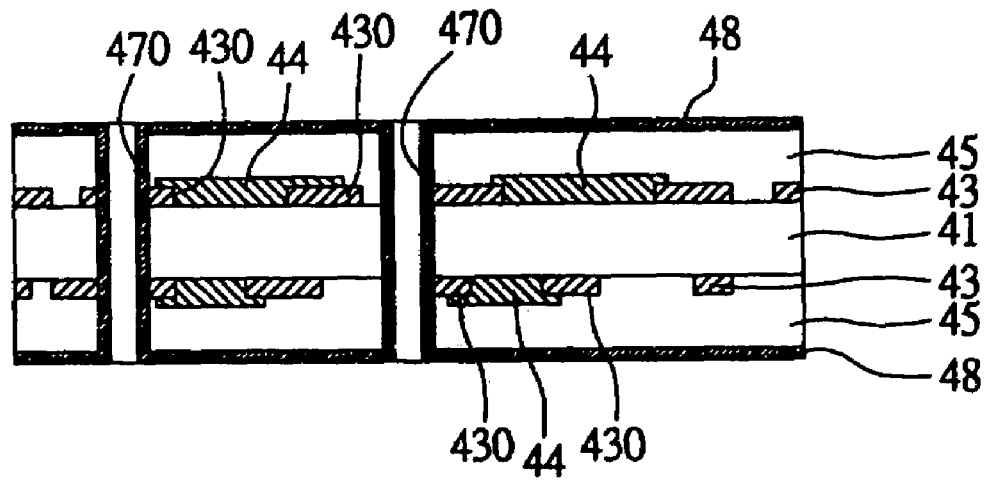

Referring to FIG. 5F, after the resistive material 44 on the first circuit layer 43 is patterned by the laser or etching technique and the resistors corresponding to the resistor electrodes 430 of the first circuit layer 43 are embedded, a plurality of through holes 47 are formed through the substrate by the mechanical drilling or laser drilling technique.

Referring to FIG. 5, a conductive metal layer 48 such as copper layer is plated on surfaces of the substrate and inner walls of the through holes 47. Then, a filling material such as an insulating material e.g. epoxy resin or a conductive material e.g. solder paste is used to fill the through holes 47, so as to form plated through holes (PTHs) 470 that are electrically connected to the resistor electrodes 430.

Figure 5H:
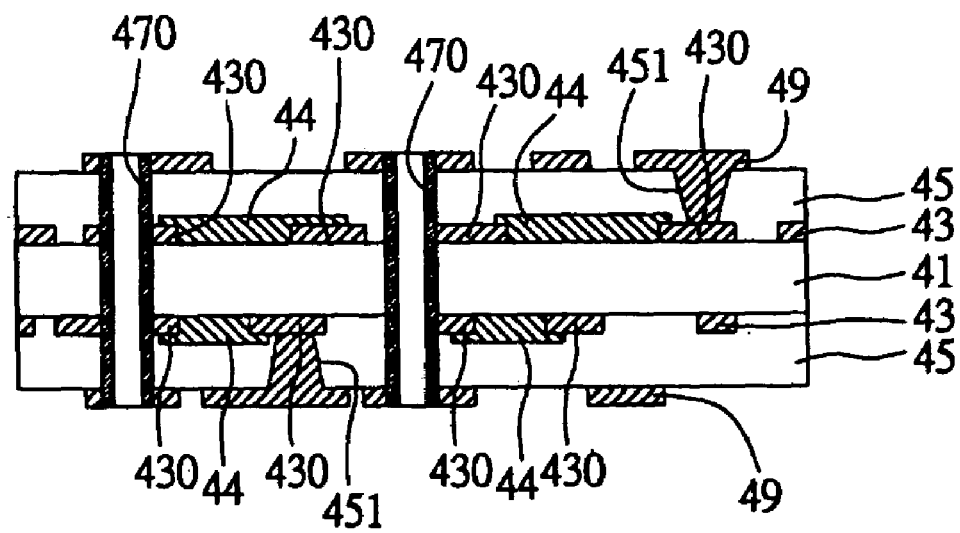

Referring to FIG. 5H, a plurality of conductive vias 451 are formed in the insulating layer 45 and at least one patterned second circuit layer 49 is formed on the insulating layer 45, such that the second circuit layer 49 is electrically connected to the resistor electrodes 430 by the conductive vias 451. This thereby completely fabricates a multi-layer package substrate with embedded resistors. Certainly, more insulating layers and circuit layers can be further built up on a surface of the substrate to fabricate a package substrate with more circuit layers. The substrate can be a flip-chip package substrate or a wire-bonding package substrate.

FIGS. 4G and 5H respectively show a semiconductor package substrate with embedded resistors according to the present invention.

This package substrate comprises an inner circuit board 41, at least one insulating layer 45, a circuit layer 46, 49 formed on the insulating layer 45, at least one resistive material 44, a plurality of resistor electrodes 430 electrically connected to the resistive material, a plurality of plated through holes 470 for electrically connecting the circuit layer to the resistor electrodes, and a plurality of conductive vias 451 formed through the insulating layer and for electrically connecting the circuit layer to the resistor electrodes.

The insulating layer 45 can be made of an organic materials, a fiber-reinforced organic material, a particle-reinforced organic material, such as epoxy resin, polyimide, bismaleimide triazine-based resin, or cyanate. The circuit layer 46, 49 can be a patterned copper layer formed by etching or electroplating technique.

The resistive material 44 comprise thick film resistive passive components or thin film resistive passive components. The thick film resistive material is made of silver powders or carbon particles dispersed in a resin, and ruthenium oxide ($RuO_2$) and glass powders dispersed in a binder to be applied and cured. The thin film resistive material is made of nickel-chromium (Ni—Cr) alloy, nickel-phosphorus (Ni—P) alloy, nickel-tin (Ni—Sn) alloy, chromium-aluminum (Cr—Al) alloy, or titanium nitride (TaN) alloy, etc., which can be formed by the sputtering, electroplating or electroless plating technique. The selection of either the thick film resistive material or the thin film resistive material depends on the fabrication cost of the multi-layer substrate and the electrical accuracy of the resistors being fabricated. Further, a desirable resistance value required for the semiconductor package substrate can be determined according to the type of resistive material being used and the size of the resistive material formed between the resistor electrodes.

The plated through holes 470 are fabricated by forming through holes in the substrate using the mechanical drilling or laser drilling technique, then coating a conductive metal layer such as copper layer over surfaces of the substrate and inner walls of the through holes, and finally applying a filling material such as an insulating material e.g. epoxy resin or a conductive material e.g. solder paste for filling the through holes. The fabricated plated through holes 470 are electrically connected to the resistor electrodes.

By the semiconductor package substrate with embedded resistors and the method for fabricating the same proposed in the present invention, the resistors are embedded in the substrate and can be incorporated in a semiconductor device using the substrate, such that the number and electrical performances of passive components provided in the semiconductor device can both be increased, and flexibility of circuit routability of the substrate can also be improved, as well as the area being used on the substrate can be reduced, which favors the size miniaturization of the semiconductor device.

For the semiconductor package substrate with embedded resistors and the method for fabricating the same proposed in the present invention, a patterned first circuit layer is first formed on an inner circuit board and is provided with a plurality of resistor electrodes. At least one resistive material is applied on a surface of the inner circuit board and patterned according to a desirable resistance value required by actual electrical performances, allowing the resistive material to partially or completely cover the resistor electrodes. That is, the desirable resistance value can be accurately determined according to the type of resistive material being used and the size such as length and area of the effective resistive material formed between the resistor electrodes, so as to prevent a reliability issue caused in a high-temperature and high-moisture environment during the subsequent fabrication processes and tests, and not to influence the electrical connection between the resistive material and the electrodes. As a result, accuracy in the resistance value of the resistors and reliability of the fabrication processes are both improved. Furthermore, the circuit layers can be electrically connected to the resistor electrodes by means of a plurality of plated through holes or conductive vias, so as to form a multi-layer package substrate with embedded resistors. This thus increases the number of passive components incorporated in the semiconductor device and improves flexibility of the circuit routability of the substrate, to meet the requirements of high integration and size miniaturization for the semiconductor package.

The foregoing drawings only show the partial resistive material. Practically, the numbers and the corresponding positions of the resistive material and the circuit layer are flexibility arranged between the laminated layers of the substrate. The resistive material can be formed on any inner circuit layer in a circuit board and is not limited to being formed on a core circuit layer of the circuit board. Also, the above fabrication processes can be applied to a single side or double sides of the inner circuit board.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package substrate with embedded resistors, the method comprising the steps of:

provided an inner circuit board having a patterned first circuit layer thereon, the first circuit layer having a plurality of resistor electrodes;

forming a patterned resistive material on the inner circuit board, and allowing the patterned resistive material to be electrically connected to the resistor electrodes and to partially or completely cover the resistor electrodes;

applying at least one insulating layer on a surface of the inner circuit board having the patterned resistive material; and forming at least one patterned second circuit layer on the insulating layer, and allowing the patterned second circuit layer to be electrically connected to the resistor electrodes by a plurality of conductive vias formed in the insulating layer.

2. The method of claim 1, wherein the inner circuit board is one selected from the group consisting of a double-layer circuit board and a multi-layer circuit board.

3. The method of claim 1, wherein the step of forming the patterned resistive material on the inner circuit board comprises:
   coating a layer of the resistive material on the inner circuit board; and
   patterning the resistive material and allowing the resistive material to be electrically connected to the resistor electrodes.

4. The method of claim 1, wherein the step of forming the patterned resistive material on the inner circuit board comprises:
   depositing the resistive material on the resistor electrodes via a screen-printing technique; and
   accurately defining a resistance value of the resistive material, such that the resistive material is electrically connected to the resistor electrodes.

5. The method of claim 1, wherein the step of forming the patterned resistive material on the inner circuit board comprises:
   forming a patterned resist layer on the inner circuit board to define an area for depositing the resistive material;
   depositing the resistive material in openings of the patterned resist layer, such that the resistive material is electrically connected to the resistor electrodes; and
   removing the resist layer.

6. A method for fabricating a semiconductor package substrate with embedded resistors, comprising the steps of:
   providing an inner circuit board having a patterned first circuit layer thereon, the first circuit layer having a plurality of resistor electrodes;
   forming a patterned resistive material on the inner circuit board, and allowing the patterned resistive material to be electrically connected to the resistor electrodes;
   applying at least one insulating layer on a surface of the inner circuit board having the patterned resistive material;
   forming a plurality of plated through holes through the insulating layer and the first circuit layer, and allowing the plated through holes to be electrically connected to the first circuit layer and the resistor electrodes; and
   forming at least one patterned second circuit layer on the insulating layer, and allowing the patterned second circuit layer to be electrically connected to the resistor electrodes by a plurality of conductive vias formed in the insulating layer.

7. The method of claim 6, wherein the inner circuit board is one selected from the group consisting of a double-layer circuit board and a multi-layer circuit board.

8. The method of claim 6, wherein the step of forming the patterned resistive material on the inner circuit board comprises:
   coating a layer of the resistive material on the inner circuit board; and
   patterning the resistive material layer, such that the resistive material is electronically connected to the resistor electrodes.

9. The method of claim 6, wherein the step of forming the patterned resistive material on the inner circuit board comprises:
   depositing the resistive material on the resistor electrodes via a screen-printing technique; and
   accurately defining a resistance value of the resistive material, such that the resistive material is electrically connected to the resistor electrodes.

10. The method of claim 6, wherein the step of forming the patterned resistive material on the inner circuit board comprises:
   forming a patterned resist layer on the inner circuit board to define an area for depositing the resistive material;
   depositing the resistive material in openings of the patterned resist layer, such that the resistive material is electrically connected to the resistor electrodes; and
   removing the resist layer.

* * * * *